United States Patent

Ohsawa et al.

[11] Patent Number: 5,221,428
[45] Date of Patent: Jun. 22, 1993

[54] PRODUCTION OF LEAD FRAME

[75] Inventors: Kenji Ohsawa; Akira Kojima; Hideyuki Takahashi, all of Kanagawa, Japan

[73] Assignee: Sony Corporation, Tokyo, Japan

[21] Appl. No.: 756,278

[22] Filed: Sep. 6, 1991

[51] Int. Cl.⁵ .............................. B44C 1/22; C23F 1/00
[52] U.S. Cl. ...................................... 156/652; 29/827; 156/656; 156/661.1; 156/644; 156/901; 437/220; 257/666
[58] Field of Search ............... 156/630, 634, 652, 656, 156/659.1, 661.1, 664, 665, 666, 901, 902, 644; 357/70; 29/827; 361/421; 437/206, 217, 220

[56] References Cited

U.S. PATENT DOCUMENTS 3,773,628 11/1973 Misawa ........................... 156/644 X Primary Examiner—William A. Powell
Attorney, Agent, or Firm—Hill, Steadman & Simpson

[57] ABSTRACT

A method for producing a lead frame which comprises selectively forming a photoresist film on both sides of a lead frame material of three-layered structure, with an etching stop layer interposed between two metal layers, etching both sides thereof using the photoresist film as a mask, and removing the unnecessary part of the etching stop layer.

6 Claims, 7 Drawing Sheets

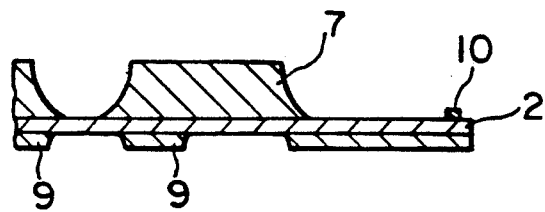
FIG.3(A)
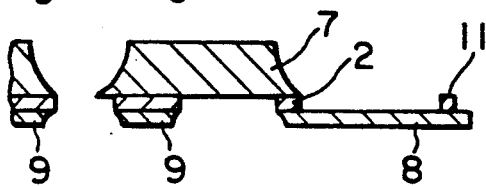
FIG.3(B)
FIG.4
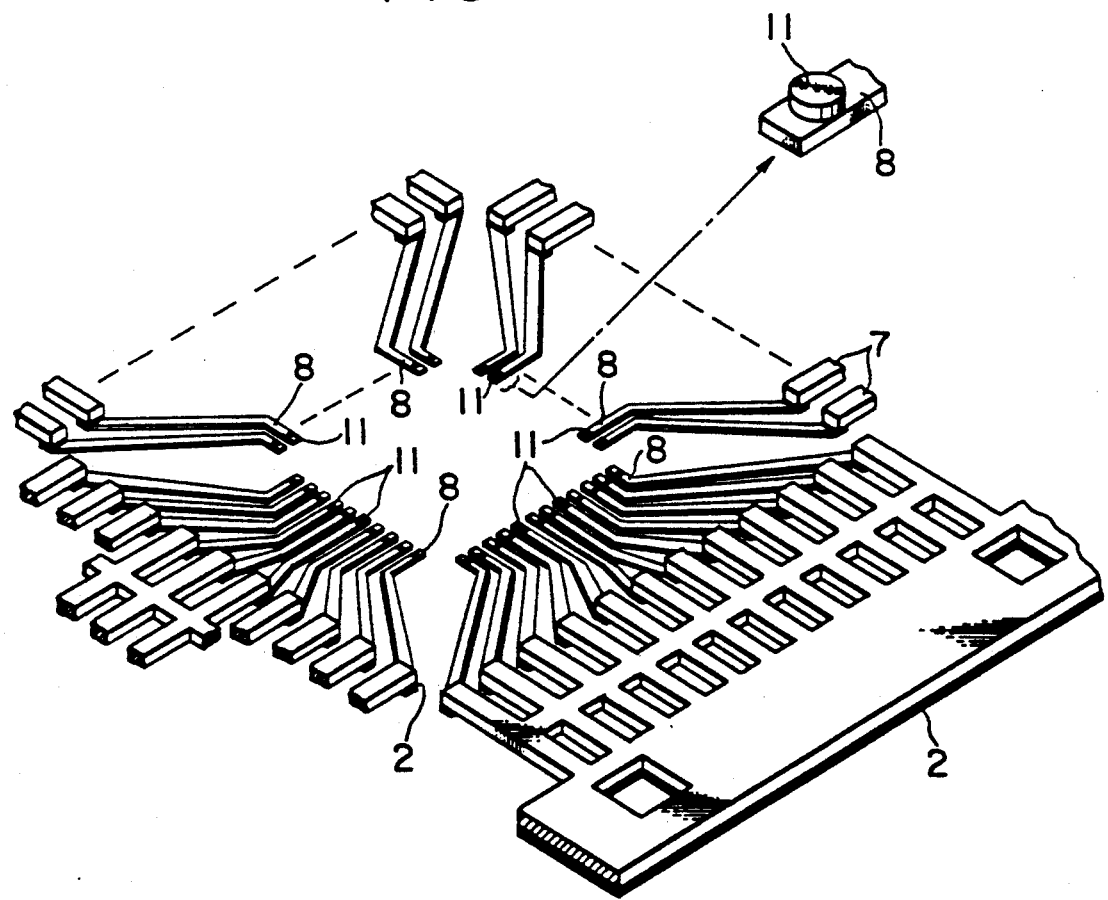

PRODUCTION OF LEAD FRAME

BACKGROUND OF THE INVENTION

1. Field of the Invention:

The present invention relates to a method for producing a lead frame. More particularly, it is concerned with a method for producing a new lead frame which has sufficient mechanical strength despite its fine inner leads for connection to an IC.

2. Description of the Prior Art:

The recent trend toward the higher degree of integration necessitates ICs and LSIs having more pins than before. This, in turn, necessitates making the lead frame, especially inner leads, finer than before.

Conventional lead frames are usually produced from a metal sheet by die-punching. This method encounters difficulties in forming a pattern with a pitch smaller than 0.3 mm. Therefore, it is not applicable to a lead frame for an IC having more than 60 pins.

To cope with this situation, there has been developed a new method for producing a lead frame from a metal sheet by etching on both sides thereof. This method is illustrated in FIGS. 8(A) to 8(C). The first step of this method consists of forming a photoresist film b on both sides of a metal sheet a (0.15-0.25 μm thick) of copper alloy or 42 alloy (Fe—Ni alloy), and exposing and developing the photoresist film b. The photoresist film b after development is shown in FIG. 8(A). It is to be noted that the photoresist film b on one side of the metal sheet is identical with the one on the other side of the metal sheet, and they are positioned such that they overlap with each other.

In the next step, the metal sheet a is etched on both sides thereof with ferric chloride, using the photoresist film b as a mask. The metal sheet after etching is shown in section in FIG. 8(B).

Finally, the photoresist film b is removed as shown in FIG. 8(C), and a desired lead frame is obtained.

A disadvantage of this method is that it is difficult to make the lead pitch smaller than the thickness of the metal sheet from which the lead frame is made, because side etching is inevitable. (Etching takes place not only in the thickness direction of the metal sheet but also in the direction perpendicular to the thickness direction.) The amount of side etching is about two-thirds of the normal etching depth as shown in FIGS. 8(B) and 8(C). Since side etching takes place at both sides, the total amount of side etching (etching depth $\times \frac{2}{3} \times 2$) affects the lead pitch. The greater the amount of side etching, the greater the minimum value of lead pitch. To reduce the lead pitch, it is necessary to reduce the amount of side etching, and to reduce the amount of side etching, it is necessary to reduce the etching depth. The etching depth depends on the thickness of the metal sheet from which the lead frame is made. To be more specific, the etching depth is half the thickness of the metal sheet for lead frame. There is a relationship between the thickness of the lead frame metal sheet and the minimum lead pitch that can be attained, as shown in FIG. 9. To attain a small lead pitch, it is necessary to use a thin metal sheet for lead frame.

The minimum thickness of the lead frame metal sheet is limited by the mechanical strength required for the lead frame. Therefore, it is practically very difficult or impossible to make the lead pitch smaller than 0.22 mm. Nevertheless, a lead pitch smaller than 0.22 mm is required for the recent ICs having a higher degree of integration.

To meet this requirement, a lead frame is produced in two steps. In the first step, that part of the lead frame metal sheet which should have a small lead pitch (or the region where the tip of the inner lead is formed) is thinned by selective etching. In the second step, etching is carried out for the patterning of the lead frame. This method needs two steps of complex etching and hence leads to a higher production cost.

Etching by the conventional method varies in etching depth depending on the subtle change in etching conditions. In an extreme case, the region where the tip of the inner lead is formed becomes too thin or disappears due to excessive etching. Because of the varying etching thickness and unstable quality, the conventional method is not of practical use.

An attempt has been made to replace the lead frame by a polyimide tape with a pattern of thin copper foil formed thereon. Unfortunately, polyimide tape is very expensive and needs a special technique for its fabrication. Moreover, polyimide does not have sufficient mechanical strength.

SUMMARY OF THE INVENTION

The present invention was completed to address the above-mentioned problems. It is an object of the present invention to provide a method for producing a new lead frame which has fine connections to an IC as well as sufficient mechanical strength.

The gist of the present invention resides in a method for producing a lead frame which comprises selectively forming a photoresist film on both sides of a lead frame material, which is a three-layered structure with an etching stop layer interposed between two metal layers, etching both sides using the photoresist film as a mask, and removing the unnecessary part of the etching stop layer.

The method of the present invention offers the advantage of forming a parent material of the lead frame by etching one of the metal layers on the etching stop layer and forming connections to an IC by etching the other metal layer. The two metal layers have mutually independent patterns because of the etching stop layer interposed between them.

According to the method of the present invention, it is possible to produce a lead frame which has fine connections to an IC and sufficient mechanical strength. This is accomplished by making provisions so that the metal layer as the parent material of the lead frame has an adequate thickness for desired mechanical strength and the metal layer as connections to an IC have an adequate thickness for desired fine connections.

BRIEF DESCRIPTION OF THE DRAWINGS

FIGS. 3(A) to 3(B) are sectional views showing the sequence of the steps for producing a lead frame in the second embodiment of the present invention.

FIG. 4 is a perspective view showing a lead frame with bumps formed thereon.

DESCRIPTION OF THE PREFERRED EMBODIMENTS

Figure 1A:
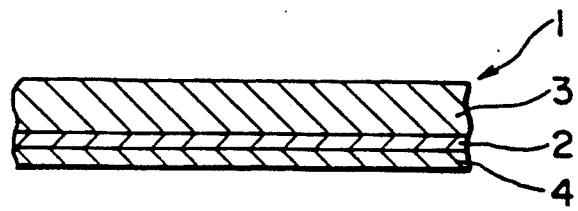
FIGS. 1(A) to 1(E) are sectional views showing the sequence of the steps for producing a lead frame in the first embodiment of the present invention.
Figure 1B:
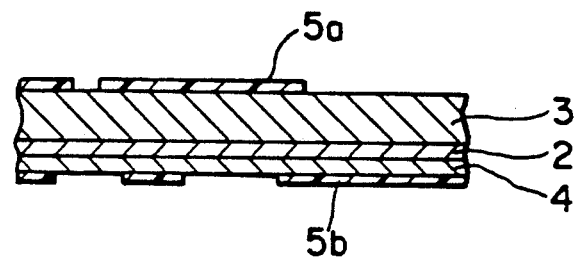

The present invention will be described in more detail with reference to the following examples.

EXAMPLE 1

A lead frame was produced in five steps (A) to (E) explained below.

(A) A metal sheet 1 for a lead frame was prepared. This metal sheet is composed of three layers, that is, an etching stop layer 2 (2-30 μm thick), a thick metal layer 3 (100-250 μm) of 42 alloy or copper alloy, and a thin metal layer 4 (10-50 μm) of copper foil. The thick metal layer 3 is for the outer lead which provides sufficient mechanical strength and the thin metal layer 4 is for the inner lead which provides fine patterns.

The etching stop layer 2 is made of aluminum so that it is not attacked by the etching solution (e.g., a mixture of $H_2O_2$ and $H_2SO_4$) for the metal layers 3 and 4. It protects the metal layer 3 from being etched when the metal layer 4 is etched, and vice versa.

(B) The surfaces of the metal layers 3 and 4 are coated with the photoresist films 5a and 5b, respectively. The surface of the thick metal layer 3 is coated with the photoresist film 5a which has a pattern constituting those parts other than the inner lead of the lead frame. The surface of the thin metal layer 4 is coated with the photoresist film 5b which has a pattern constituting those parts with a large thickness in the neighborhood of the inner lead and guide hole. The photoresist film 5 should be made such that the opening part has a minimum width of 10-20 μm. The opening width at the thick part (in the neighborhood of guide hole 6) should be properly determined with the amount of side etching taken into account.

Figure 1C:
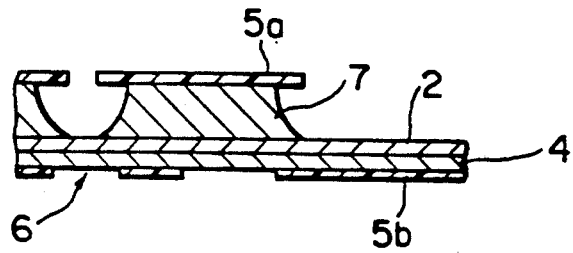

(C) The thick metal layer 3 of the lead frame material 1 is etched by spraying with an etchant composed of $H_2O_2$ and $H_2SO_4$ at a pressure of 2 kg/cm² for 3 minutes. This selective etching forms the outer lead 7 as the parent material of the lead frame, as shown in FIG. 1(C).

Figure 1D:
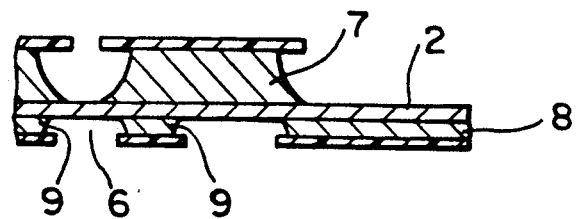

(D) The thin metal layer 4 is etched by spraying with the same etchant as mentioned above at a pressure of 2 kg/cm² for 2 minutes. This selective etching forms the thick part 9 constituting the inner lead 8 and guide hole 6, as shown in FIG. 1(D). If the metal layer 4 is an 18-μm thick copper foil, it is possible to form very fine inner leads 8, 8, ... at a pitch of about 40 μm. This satisfies the requirements for the increasing pin number.

Figure 2A:
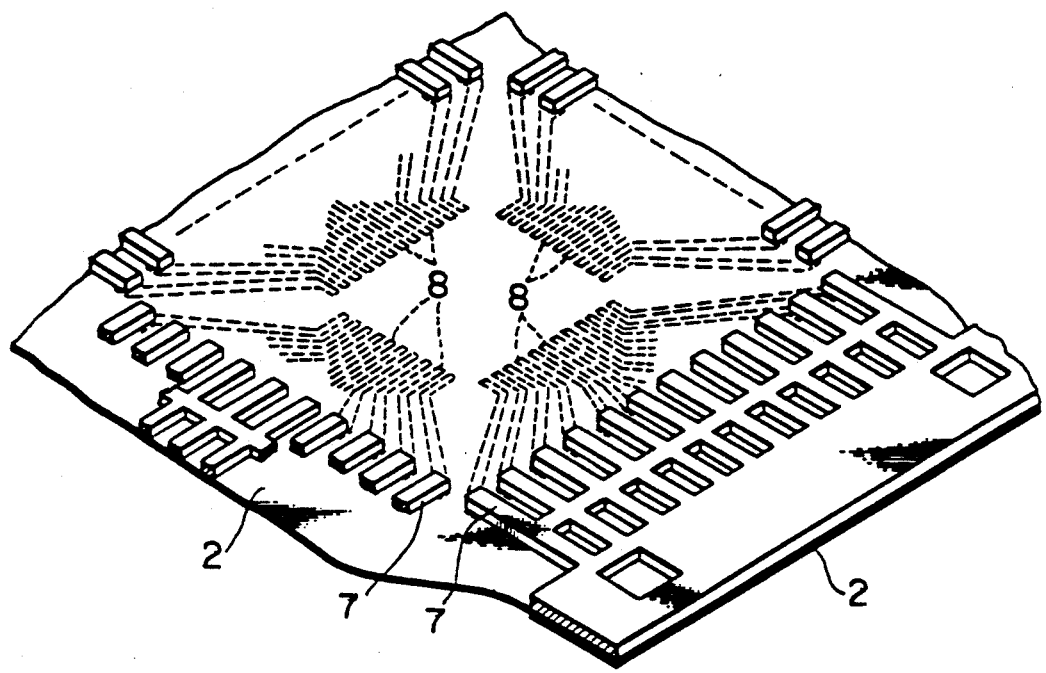
FIGS. 2(A) to 2(B) are perspective views showing the sequence of the steps in the first embodiment.

The photoresist films 5a and 5b are removed by a solvent. The appearance after etching, with the photoresist films 5a and 5b removed, is shown in perspective in FIG. 2(A).

Figure 1E:
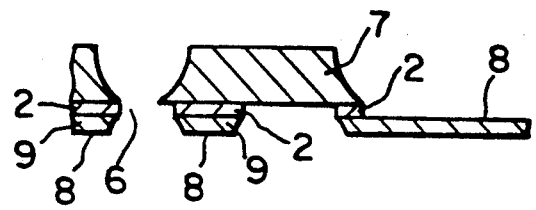
Figure 2B:
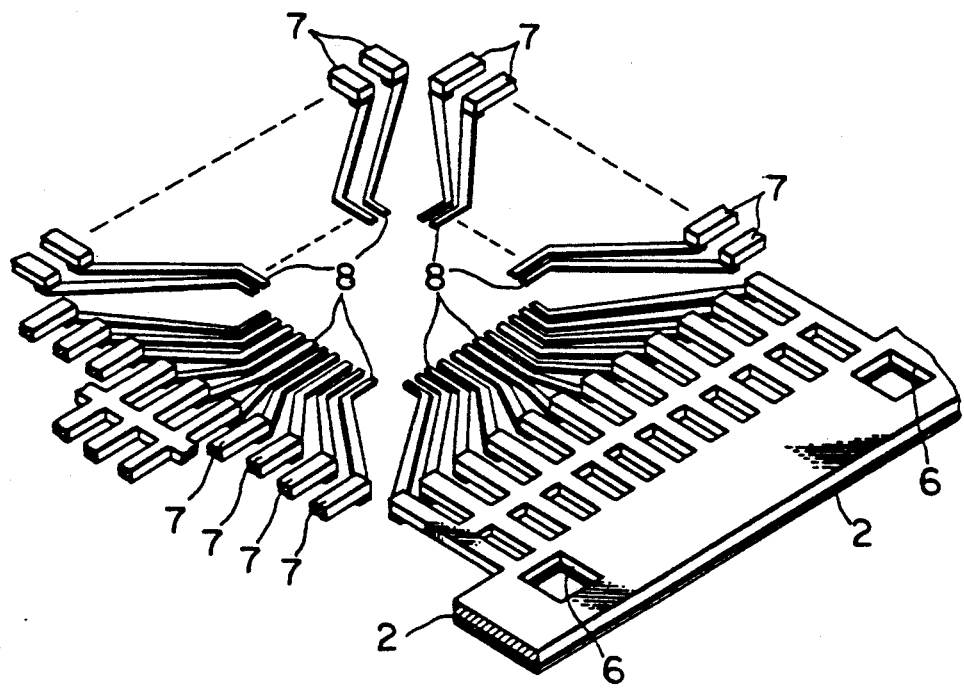

(E) Finally, the etching stop layer 2 is removed by etching with an alkaline solution ($Na_2CO_3$, NaOH, or KOH). Only that part of the etching stop layer 2 which is held between the metal layer 3 and the metal layer 4 remains unetched, as shown in FIG. 1(E). Thus a desired lead frame is completed, as shown in FIG. 2(B).

If necessary, the completed lead frame may be entirely or partly plated with tin, gold, or solder (10% lead and 90% tin). To facilitate plating, the surface of the remaining etching stop layer 2 should preferably be activated by zinc substitution prior to plating.

In this example, the selective etching was followed by the removal of the photoresist films 5a and 5b and the removal of the etching stop layer 2, which were carried out separately. However, the removing steps may be carried out simultaneously using an alkaline solution. In addition, the removal of the photoresist films may be facilitated by the aid of ultrasonic.

An advantage of the method used in this example is that the metal layer 3 of the lead frame material 1 can be fabricated by etching into an outer lead having a desired thickness to ensure sufficient mechanical strength and the metal layer 4 of the lead frame material 1 can be fabricated by etching into fine inner leads 8, 8, ... This is because the metal layers 3 and 4 can be etched independently owing to the etching stop layer 2 interposed between them.

Thus the resulting lead frame has sufficient mechanical strength and fine inner leads. Performing etching independently means that the etching of the metal layer 3 does not affect the metal layer 4, and vice versa. It is also possible to perform etching on the metal layers 3 and 4 simultaneously.

EXAMPLE 2

A lead frame with bumps was produced in the following manner.

(A) Selective etching was performed on the metal layers 3 and 4 of the lead frame material 1, and the photoresist films 5a and 5b were removed. That part of the etching stop layer 2 on which bumps are made was masked by the photoresist film 10, as shown in FIG. 3(A).

(B) The etching stop layer 2 was removed by an alkaline solution. Thus the bump 11 was formed beneath the photoresist film 10. Finally, the photoresist film 10 was removed. The lead frame, with the photoresist film 10 removed, is shown in FIG. 3(B) and FIG. 4.

As in Example 1, the lead frame in this example has sufficient mechanical strength and fine inner leads 8. In addition, it has the bumps 11 formed on the inner leads 8.

According to this method, the circular bump 11 is formed on the tip of the inner lead 8 of the etching stop layer 2. Therefore, it is necessary to form the photoresist film 10 on the tip of the inner lead 8 independently. In addition, this needs accurate positioning for exposure. To eliminate this disadvantage, the method can be modified as follows.

Figure 5A:
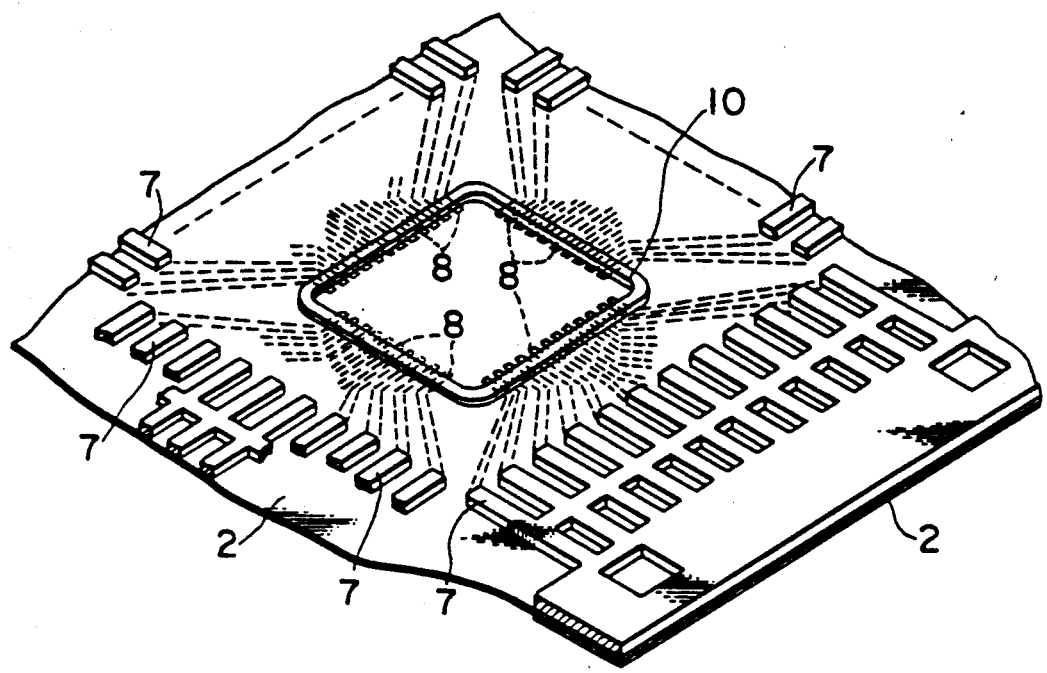
FIGS. 5(A) and 5(B) are perspective views showing the modified steps for producing a lead frame in the second embodiment.

(A) The same procedure as mentioned above is employed for etching the metal layers 3 and 4 and removing the photoresist film used as a mask for etching. On the etching stop layer 2 is formed the photoresist film 10 in a pattern of square hollow box, as shown in FIG. 5(A). In other words, this photoresist film 10 crosses the tips of the inner leads 8.

Figure 5B:
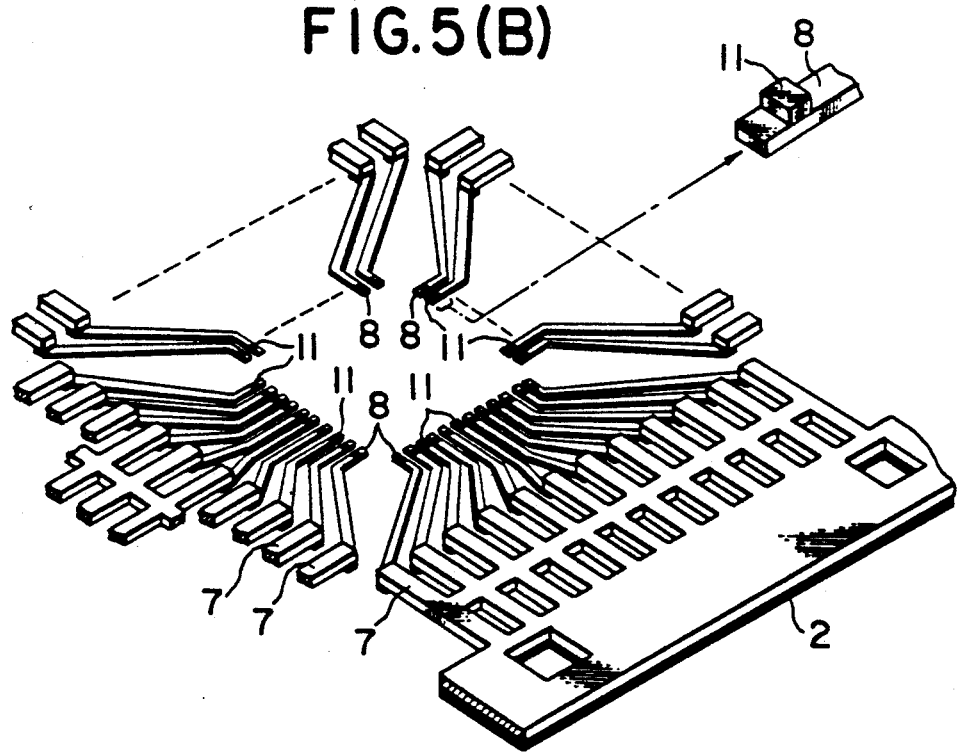

(B) The etching stop layer 2 is removed. Thus, the square bump 11 (of etching stop layer which is aluminum in this example) is formed on the tip of each inner lead 8. Finally, the photoresist film 10 is removed. The lead frame, with the photoresist film 10 removed, is shown in FIG. 5(B).

EXAMPLE 3

A lead frame was produced in the following manner.

Figure 6A:
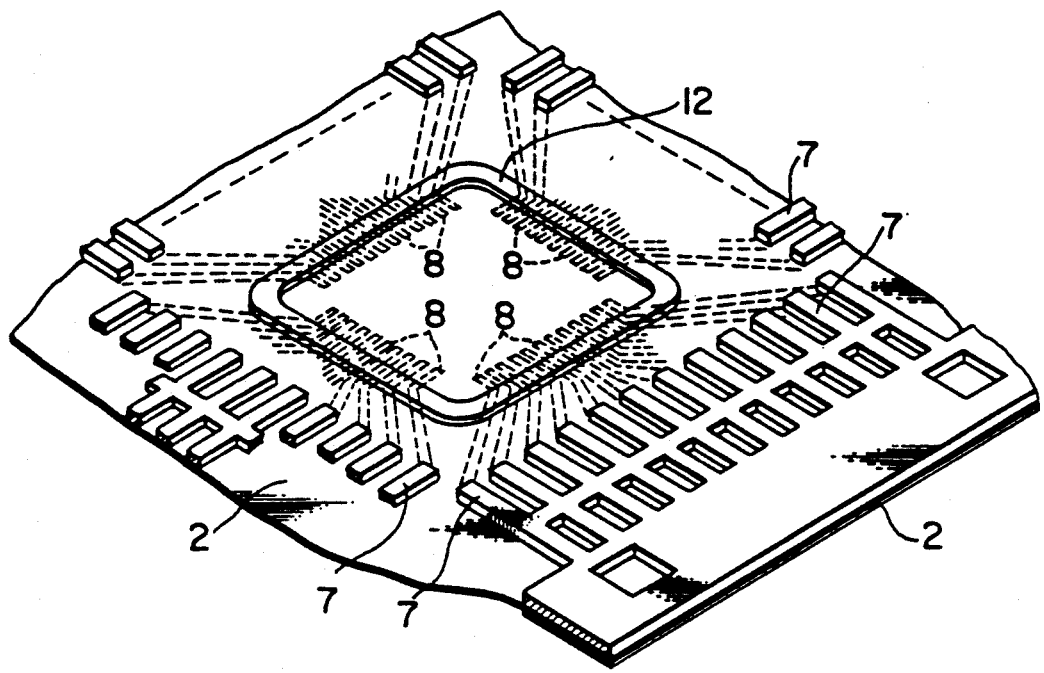
FIGS. 6(A) and 6(B) are perspective views showing the sequence of the steps for producing a lead frame in the third embodiment of the present invention.

(A) After the etching of the metal layers 3 and 4 and the removal of the photoresist film used as a mask for etching, a reinforcement 12 of resin was formed on that side of the etching stop layer 2 on which the outer lead is formed, as shown in FIG. 6(A). This reinforcement is intended to reinforce the fine inner lead which is liable to bending, shorting, and breakage due to low mechanical strength.

Figure 6B:
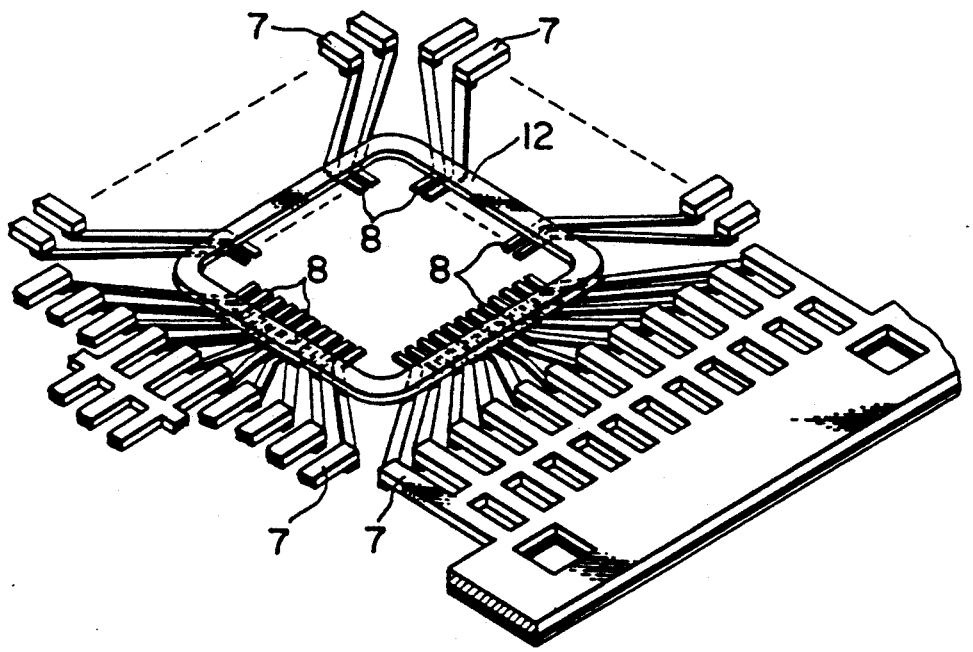

(B) Then the etching stop layer 2 is removed. The reinforcement 12 fixes the inner leads 8, 8, ... through the remaining etching stop layer 2, as shown in FIG. 6(B). Thus the reinforcement prevents the inner leads 8, 8, ... from bending and shorting. This greatly improves the reliability of the lead frame.

Incidentally, the reinforcement 12 may be formed on the surface of the inner leads 8, 8, ..., in which case the reinforcement 12 may be formed on either the surface of the inner lead or that side of the etching stop layer 2 which is adjacent to the outer lead, before the etching stop layer 2 is removed.

EXAMPLE 4

A lead frame with bumps was produced by forming bumps on the metal layer 4 of the lead frame material 1. The method in this example offers an advantage over the conventional method as explained below.

The conventional method for producing a lead frame with bumps consists of etching a thick metal (copper) foil according to the pattern of a lead frame, masking those parts on which bumps are formed, performing half-etching, masking other parts than bumps with a photoresist, and plating the bumps with gold. This conventional method suffers from several disadvantages. It is very difficult to form the photoresist film as the mask for half-etching, because it has to be made on the irregular surface resulting from the first etching. It is also very difficult to control the etching depth in half-etching. Moreover, it is necessary to repeat the photographic process three times, which leads to a very high production cost.

There is another conventional method for forming bumps on the inner leads by transfer. This method consists of coating a glass substrate entirely with a conductive layer (such as tin) by vapor deposition, selectively forming a photoresist film on the conductive layer, forming a gold layer by plating on the unmasked part of the conductive layer, and transferring the gold plating layer by thermal pressing to the tip of the inner lead of the lead frame. A disadvantage of this method is the difficulty in aligning the substrate (on which the gold plating layer is formed) with the lead frame. This causes the dislocation of bumps. Another disadvantage of this method is the difficulty in controlling the plating thickness. This leads to variations in bump thickness. This holds true particularly in high-speed electroplating, in which case the plating film tends to be thin at the center and thick in the periphery owing to variations in electric field strength. The method in this example was developed to eliminate these disadvantages.

A lead frame with bumps was produced in four steps (A) to (D) explained below.

Figure 7A:
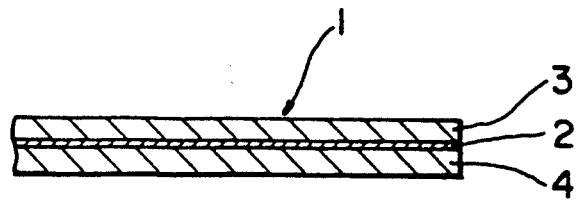
FIGS. 7(A) to 7(D) are sectional views showing the sequence of the steps for producing a lead frame in the fourth embodiment of the present invention.

(A) A three-layered metal sheet 1 for a lead frame was prepared. This metal sheet is composed of an aluminum etching stop layer 2 (2–30 μm thick), a copper layer 3 (10–30 μm thick) as the lead frame proper, and a metal layer 4 (10–50 μm thick) on which bumps and guide holes are formed, as shown in FIG. 7(A). The etching stop layer 2 is interposed between the metal layers 3 and 4.

Figure 7B:
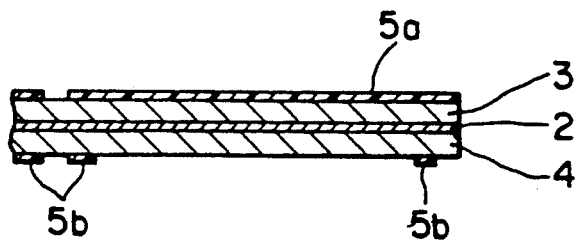

(B) On the metal layers 3 and 4 were selectively formed photoresist films 5a and 5b, as shown in FIG. 7(B). The photoresist film 5a masking the metal layer 3 has a pattern conforming to the lead frame proper. The photoresist film 5b on the metal layer 4 has a pattern conforming to the bumps 11 and guide holes.

Figure 7C:
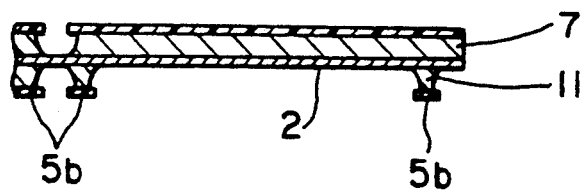

(C) The metal layers 3 and 4 were etched simultaneously using the photoresist films 5a and 5b as the mask. The etchant is a mixture of $H_2O_2$ and $H_2SO_4$. Etching of the metal layer 3 formed the lead frame proper, and etching of the metal layer 4 formed the bumps 11 and guide holes 6, as shown in FIG. 7(C). Subsequently, the photoresist films 5a and 5b were removed. In this example, etching was performed on sides of the metal sheet at one time; but etching may be performed sequentially as in the case of Example 1.

Figure 7D:
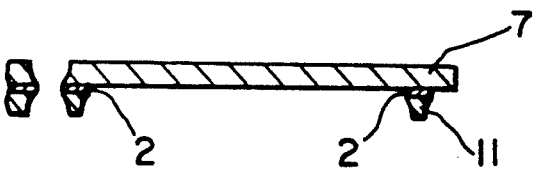
Figure 8A:
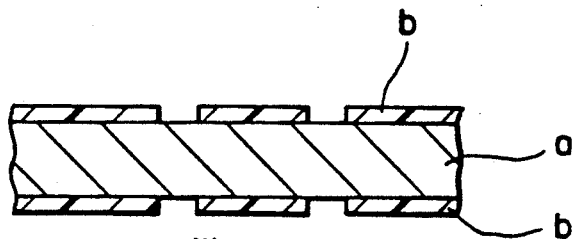
FIGS. 8(A) to 8(C) are sectional views showing the conventional steps for producing a lead frame.
Figure 8B:
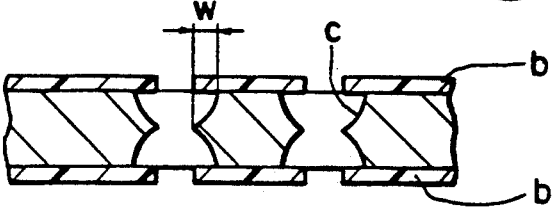
Figure 8C:
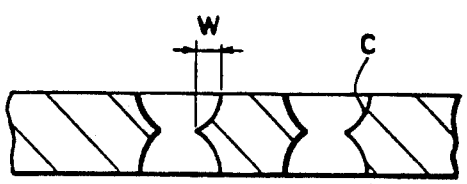
Figure 9:
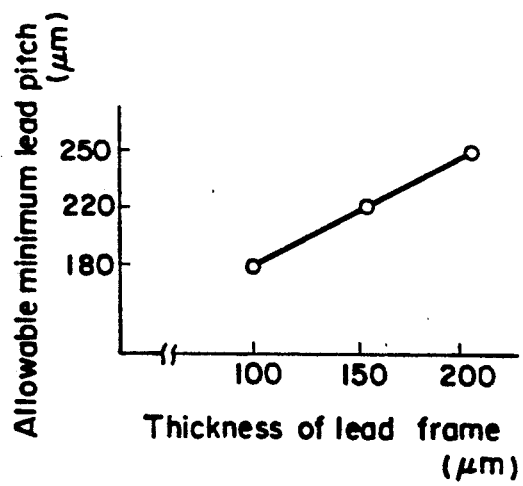
FIG. 9 is a graph showing the relationship between the lead frame thickness and the lead pitch, which is presented to illustrate the problem to be solved by the present invention.

(D) The etching stop layer 2 was removed as shown in FIG. 7(D). Thus there was obtained a lead frame with bumps. The bumps 11 are plated with gold and then connected to the IC's electrode pads through an aluminum-gold eutectic alloy. (Alternatively, connections may be formed by means of an anisotropic conductive sheet. This connecting method obviates gold plating and achieves connection by thermal pressing.)

The method in this example needs only a single photographic step for pattering the lead frame material, which leads to the reduction of production cost. According to this method, the photoresist film is formed on a flat surface of the metal layer. Therefore, it is easy to carry out the photographic step and to form the lead frame and place the bumps as designed. In addition, the bumps have a uniform thickness unlike those which are formed by plating. Adhesion between the lead frame and the bumps depends on adhesion between the metal layers and the etching stop layer. Therefore, there is no possibility that the bumps peel off from the lead frame. Thus, with the method in this example, it is possible to produce a lead frame with bumps which has high stability and reliability.

Effects of the invention

As mentioned above, the first aspect of the present invention provides a method for producing a lead frame which comprises selectively forming a photoresist film on both sides of a lead frame material of the three-layered structure, with an etching stop layer interposed between two metal layers, etching both sides thereof using the photoresist film as a mask, and removing the unnecessary part of the etching stop layer.

According to this method, the parent material for a lead frame is formed by etching one metal layer on the etching stop layer and the connections to an IC are formed by etching the other metal layer on the etching stop layer. The two metal layers are formed independently into different patterns because they are separated by the etching stop layer. Therefore, the metal layer as the parent material of the lead frame can be thick enough for desired mechanical strength and the metal layer as the connections to an IC can be thin enough for connection. Thus the resulting lead frame has sufficient strength as well as fine connections to an IC.

The second aspect of the present invention is a modification of the first aspect of the present invention, which is characterized by forming the other metal layer into the inner lead. According to this method, it is possible to produce a lead frame having fine inner leads and sufficient mechanical strength.

The third aspect of the present invention is a modification of the second aspect of the present invention, which is characterized by forming a reinforcement for the inner lead before removing the unnecessary part of the etching stop layer after the etching of the metal layer. According to this method, it is possible to reinforce the fine inner leads with a reinforcement. This reinforcement prevents the inner leads from bending, breaking, and shorting, which leads to a decrease in rejection rate.

The fourth aspect of the present invention is a modification of the first aspect of the present invention, which is characterized by making the bumps from the other metal layer. This method needs only a single photographic step and forms bumps of uniform thickness with high adhesion. This leads to high reliability and low production cost.

What is claimed is:

1. A method for producing a lead frame having outer leads with a first thickness and inner leads with a second thickness, said second thickness being less than the first thickness, said method comprising the steps of providing a sheet of material having a three-layered structure including a first metal layer with a 2-30 $\mu$m thickness interposed between a second metal layer with a 100-250 $\mu$m thickness and a third metal layer with a 10-50 $\mu$m thickness, said first metal layer being a material acting as an etching stop layer for any etching materials for the second and third metal layers; selectively forming a photoresist film on both exposed surface of the second metal layer and the third metal layer with the photoresist film on the third metal layer having a different pattern than that on the second metal layer; etching both sides of the sheet of material with an etching material attacking the second and third metal layers and not attacking the first metal layer to form outer leads in the second metal layer and inner leads in the third metal layer, removing the photoresist films and etching the exposed portions of the first metal layer with a second etching solution which does not etch the second and third metal layers to remove the exposed portions of the first metal layer.

2. A method as claimed in claim 1, wherein the first metal layer is made of aluminum, the second metal layer is made of 42 alloy or copper alloy, and the third metal layer is made of copper.

3. A method according to claim 1, which includes a step of applying a reinforcing for the inner leads after removing the photoresist film and prior to etching the exposed portions of the first metal layer.

4. A method according to claim 1, which includes, subsequent to the removing the resist films from the remaining portions of the second and third layers, applying a resist layer on selected portions of an exposed surface of the first metal layer formed by removing the second metal layer, so that in a subsequent etching to remove exposed portions of the first metal layer, portions of the first metal layer will remain on the inner leads to form bumps thereon.

5. A method for producing a lead frame having leads having bumps, said method comprising the steps of providing a sheet of material having a three-layered structure including a first metal layer with a 2-30 $\mu$m thickness interposed between a second metal layer of 10-100 $\mu$m thickness and a third metal layer with a 10-50 $\mu$m thickness, said first metal layer being of a material acting as an etching stop layer for any etching material for the second and third metal layers; selectively forming a photoresist on both sides of the sheet of material with the photoresist film on the second metal layer having a substantially different pattern than the photoresist film on the third metal layer, etching both sides of the sheet of material with an etching material not attacking the first metal layer to form a parent material of the lead frame out of the second metal layer and to make bumps out of the third metal layer on said parent material, subsequently removing the photoresist film and then etching the first metal layer with a material not attacking the second and third metal layers to remove the exposed portions of said first metal layer.

6. A method as claimed in claim 5, wherein the first metal layer is made of aluminum and the second and third metal layers are made of copper.

* * * * *